US006720708B2

United States Patent

Athanas

(10) Patent No.: US 6,720,708 B2
(45) Date of Patent: Apr. 13, 2004

(54) MECHANICAL-TO-ACOUSTICAL TRANSFORMER AND MULTI-MEDIA FLAT FILM SPEAKER

(75) Inventor: Lewis Athanas, 83 Middle St., West Newbury, MA (US) 01985

(73) Assignee: Lewis Athanas, West Newbury, MA (US)

( * ) Notice: Subject to any disclaimer, the term of this patent is extended or adjusted under 35 U.S.C. 154(b) by 214 days.

(21) Appl. No.: 09/755,895

(22) Filed: Jan. 5, 2001

(65) Prior Publication Data

US 2001/0026626 A1 Oct. 4, 2001

Related U.S. Application Data

(60) Provisional application No. 60/175,022, filed on Jan. 7, 2000.

(51) Int. Cl.[7] ........................................ H01L 41/08
(52) U.S. Cl. ........................................ 310/324; 310/317
(58) Field of Search ........................................ 310/311, 317, 310/324, 328

(56) References Cited

U.S. PATENT DOCUMENTS

| | | | | |
|---|---|---|---|---|
| 4,170,742 A | * | 10/1979 | Itagaki et al. | 310/324 |
| 4,352,961 A | | 10/1982 | Kumada et al. | 179/110 A |
| 4,578,613 A | * | 3/1986 | Posthuma de Boer et al. | 310/800 |
| 5,283,835 A | | 2/1994 | Athanas | 381/190 |
| 5,608,282 A | | 3/1997 | Wilber et al. | 505/211 |
| 5,652,801 A | | 7/1997 | Paddock | 381/190 |
| 5,767,612 A | | 6/1998 | Takeuchi et al. | 310/324 |
| 5,867,302 A | | 2/1999 | Fleming | 359/291 |
| 6,003,766 A | | 12/1999 | Azima et al. | 235/379 |
| 6,218,766 B1 | * | 4/2001 | Warnaka et al. | 310/322 |

FOREIGN PATENT DOCUMENTS

| | | | |
|---|---|---|---|
| JP | 2001-320798 | * 11/2001 | H04R/17/00 |

* cited by examiner

*Primary Examiner*—Thomas M. Dougherty
(74) *Attorney, Agent, or Firm*—Grossman, Tucker, Perreault & Pfleger, PLLC

(57) ABSTRACT

A mechanical-to-acoustical transducer has at least one actuator, preferably a piezo motor, that is coupled, generally perpendicularly, to one edge of a diaphragm formed from a thin, flexible sheet material. The diaphragm is fixed at a point spaced from the actuator in the direction of its motion so that excursion of the actuator is translated into a corresponding, mechanically-amplified, excursion of the diaphragm—typically amplified five to seven times. The diaphragm is curved, preferably parabolically, and to a small degree. The diaphragm, if optically clear, can be mounted on a frame over a video display screen to provide a screen speaker. Preferably, such a screen speaker is pinned or adhered at upper and lower edges at or near its vertical centerline and is supported by and driven at both lateral edges by one or more single layer piezo actuators. The actuators are secured at one end to the frame or other stationary member, and at a free, movable end, to an edge of the diaphragm, generally at right angles. A gasket seals the edges of the diaphragm to maintain an acoustic pressure gradient across the diaphragm.

14 Claims, 9 Drawing Sheets

MECHANICAL-TO-ACOUSTICAL TRANSFORMER AND MULTI-MEDIA FLAT FILM SPEAKER

CROSS REFERENCE TO RELATED APPLICATION

This application claims the benefit of U.S. Provisional Application No. 60/175,022, filed Jan. 7, 2000.

BACKGROUND OF THE INVENTION

This invention relates to transducers that convert mechanical energy into acoustical energy. More specifically, it relates in one form to a loudspeaker with a piezoelectric actuator and in another form to a flat film speaker compatible with a video display.

All acoustic transducers must supply the atmosphere with an alternating positive and negative pressure. In its simplest form a linear motor, whether electromagnetic, electrostatic or piezoelectric, actuates a diaphragm that is sometimes part of the motor itself.

The overwhelming majority of loudspeakers are electromagnetic transducers. Referred to as dynamic loudspeakers, this class has essentially remained unchanged since the 1920's. Electromagnetic motors have long linear travel. This attribute is used to move a relatively small rigid diaphragm (in the manner of a piston, or "pistonic" as the term is used in the loudspeaker art) over the long excursions needed for acoustic use. The tradeoff is the low efficiency of this action at a distance.

Electrostatic and piezo devices have a much higher electrical-to-mechanical coupling efficiency than dynamic loudspeakers. They have been used to a limited degree for many decades, but their theoretical high efficiency has been limited by their comparatively short linear travel. In the case of electrostatics, very large diaphragm structures, several feet long on each side, are needed to generate the required acoustic displacement—or they are simply built small enough to be of practical size, but limited to operation in the upper frequencies where long excursions are not needed. Piezoelectrics have the highest theoretical efficiency of all, but they have been relegated to the upper frequencies exclusively because of their comparatively small size and limited excursion.

It is therefore an object of this invention to provide a new class of mechanical-to-acoustical transducers, especially loudspeakers, that can employ any of the aforementioned actuators, but are particularly well suited to transforming the high efficiency, short linear travel of a piezo motor into a high-excursion, pistonic-equivalent diaphragm movement.

Another object of this invention is to provide a flat, film-type speaker for televisions, computer monitors, or the like where the display is viewed through the speaker.

SUMMARY OF THE INVENTION

A mechanical-to-acoustical transducer according to the present invention has at least one actuator, preferably a piezo motor, coupled to a thin, rigid, yet flexible, diaphragm that is anchored at a location spaced from the point or points of coupling of the diaphragm to the actuator. The diaphragm is curved when viewed in vertical section between the point of the actuator coupling and the anchoring point or points. The diaphragm is formed of a thin, flexible sheet material. For screen-speaker applications, it is formed of a material that is transparent as well.

In one form, the actuator is located at or near a vertical centerline that divides the diaphragm into two sections (in effect providing two transducers). The lateral edges of the diaphragm distal from the actuator are fixed at both edges to anchor them against movement. The fixed edges can be secured to a frame that supports the diaphragm and a piezo bimorph drive. A gasket secured at the edges of the diaphragm helps to maintain the pressure gradient of the system. The two diaphragm sections each have a slight parabolic curvature viewed in a plane through the diaphragm, and orthogonal to the vertical axis. One section is curved convexly and the other concavely in an overall "S" shape when the piezo bimorph is in a centered, rest position. A DC potential can be used to minimize hysteresis that is present in piezo structures. Hysteresis is also present in the linear magnetic motors commonly used in the typical loudspeaker, but this hysteresis cannot be countered actively as it can with a biomorph. With the actuator at the midpoint of the "S" curve, positive and negative diaphragm displacement asymmetries cancel out, yielding a substantially linear net diaphragm excursion in response to an essentially linear lateral excursion of the drive.

The actuators useful in loudspeaker applications are characterized by a high force and a short excursion. The diaphragm is characterized by a large, pistonic-equivalent excursion. A typical amplification, or mechanical leveraging, of the excursion is five to seven fold. Multiple actuators arrayed end-to-end can drive different vertically arrayed portions of the diaphragm. In another form, the actuator is secured to one lateral edge of the diaphragm.

In another form, the invention uses a diaphragm that is a thin sheet of a rigid transparent material secured over a video display screen of a television, computer monitor, or the like. In a preferred form, the sheet is mechanically pinned and/or adhesively bonded along or near its vertical centerline (preferably at its top and bottom edges) to create two lateral sections, or "wings", each with three free edges, upper, lower and lateral. Linear actuators are operatively coupled to the free lateral edges of both wings, preferably by adhesive bonding with the diaphragm edge abutting a free end of the actuator generally at right angles. A lateral linear motion of each actuator then causes an increase or decrease in a slight curvature of an associated wing. The curvature is preferably that of a parabola (viewed in a plane orthogonal to a vertical axis, e.g., the pinned centerline). For typical video displays it has a "radius" of about one meter ("radius" assuming that the parabola is closely approximated by a circle of the radius).

The actuators are electromechanical, such as electromagnetic, piezoelectric, or electrostatic. Piezo actuators do not create a magnetic field that interferes with the display image and are preferred. For loudspeaker applications, the actuators are typically high-force, short-excursion types. The speaker of this invention converts this movement actuator into a low-pressure, amplified-excursion diaphragm movement. The sheet may have a layer of a polarizing material bonded to it to control screen glare, or utilize other known treatments that are either applied or molded onto the surface of the diaphragm to produce optical effects such as glare reduction.

These and other features and objects of this invention will be more readily understood from the following detailed description that should be read in light of the accompanying drawings.

DESCRIPTION OF THE PREFERRED EMBODIMENTS

FIGS. 1–6 show a first form of the present invention, a mechanical-to-acoustical transducer 10 particularly adapted for use as a loudspeaker capable of transforming the output of a high-force, short-linear-travel driving mechanism, actuator 12, into a corresponding, amplifier movement of a high excursion, pistonic-equivalent movement of a diaphragm 14. "High" force as used herein means high as compared to the force of a drive of a conventional loudspeaker, typically at least an order of magnitude greater. A 40:1 ratio is characteristic of the difference in force. The motion amplifier provided by this invention is typically on the order of five to seven fold.

Figure 1:
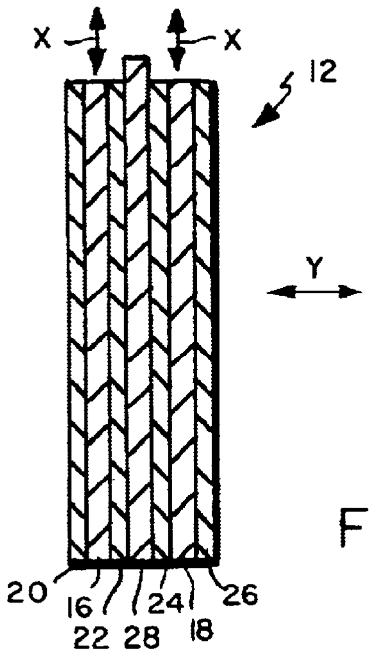
FIG. 1 is a view in vertical section of a high-force, short-excursion piezo bimorph actuator used in this invention.

A piezo bimorph is one type of suitable drive mechanism or actuator 12 for this invention. The piezo bimorph drive supplied by Piezo Systems Inc., 186 Massachusetts Avenue, Cambridge Mass. 02139, part #58-S4-ENH, is presently preferred for the FIGS. 1–6 loudspeaker application. As shown in FIG. 1, the drive 12 is essentially a seven layer device consisting of two layers or "wafers" 16, 18 of piezo material with a conductive coating 20, 22, 24, 26 on each side bonded to a central substrate 28 of brass, Kevlar, or other material. The substrate provides some spring force. It also can act as a dampener and when it is insulating, provide a capacitance load, both of which can be used to shape the frequency response of the drive. The piezo wafers 16, 18 expand or contract in the X-axis (a direction generally aligned with vertical axis 30 and lying in the wafer), as best seen in FIG. 5. These coatings 20, 22, 24, 26 are wired out of phase with each other, so that for a given voltage, the polarities are reversed. As a result, one wafer 16, 18 expands, and the other wafer 16, 18 contracts. The final bending motion D far exceeds the expansion of a single piezo wafer's movement. At 60 Volts, the bimorph described above has an excursion of 0.3 mm, the equivalent of 1.09 Watts at 500 Hz.

Figure 2:
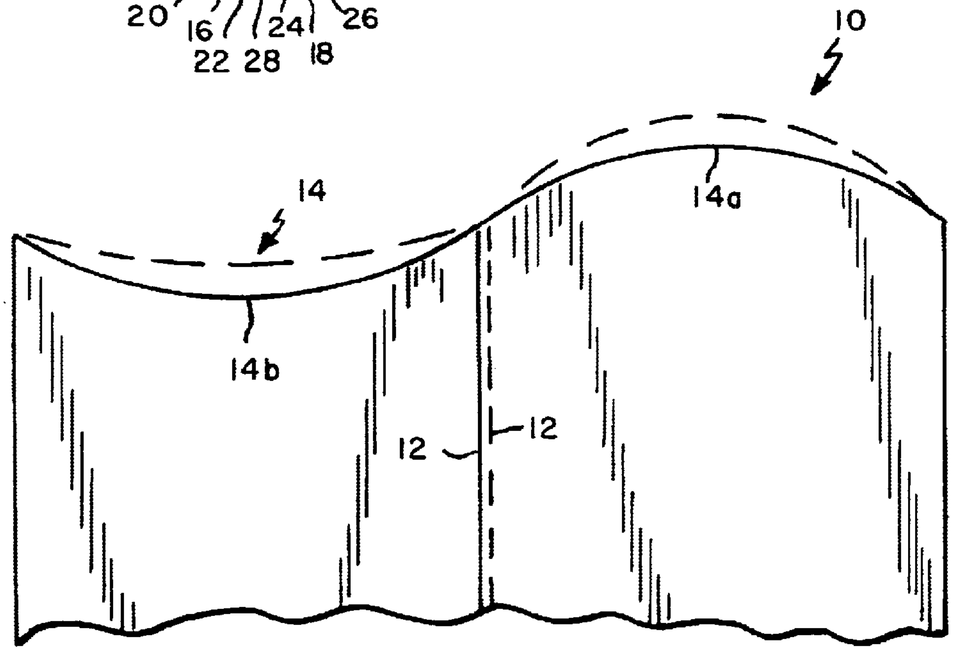
FIG. 2 is a schematic of a transducer according to the present invention using the piezo bimorph shown in FIG. 1 shown in a rest position (solid line) and a right-flexed position (dashed line) and coupled to drive an S-shaped diaphragm.

The piezo bimorph 12 under electrical stimulus produces a positive and negative motion along the X-axis that produces a corresponding positive and negative pistonic displacement along the Y-axis (FIGS. 1 and 5) by flexing and unflexing the diaphragm 14. This action for a half cycle, right hand excursion is shown in FIG. 2. Because actuator 12 is fixed at one end, this motion along the X axis as it is driven produces a mechanical levering.

The diaphragm is a thin, flexible sheet formed in a curvature of a parabolic section. The diaphragm may be any high Young's Modulus material including such plastics as Kapton (poly amide-imide), polycarbonate, PVDF, polypropylene, or related polymer blends; or optical quality materials such as tri-acetates, and tempered glass; or titanium or other metals with similar flexing properties; or resin doped fabrics or other composites.

The following relationships affect the efficiency and frequency response of the transducer:

The displacement for a given input (efficiency) is proportional to the radius of curvature of the diaphragm.

The positive and negative displacement asymmetry is proportional to the radius of curvature of the diaphragm.

The high frequency resonance (maxima of acoustic output) is inversely proportional to the radius of curvature of the diaphragm.

The high frequency resonance is proportional to the Young's Modulus of the diaphragm material.

The high frequency resonance is inversely proportional to the mass of the diaphragm.

Figure 3:
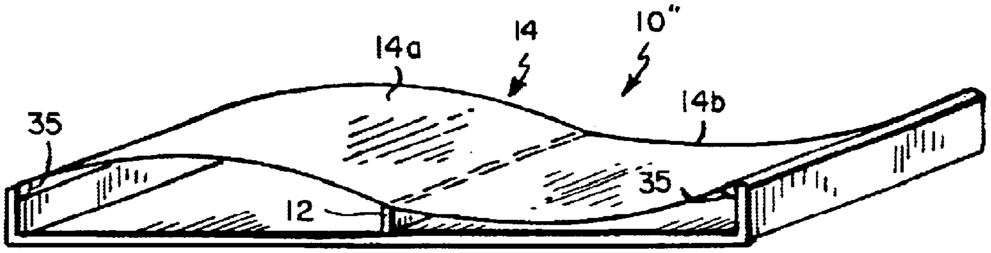
FIG. 3 is a view in perspective of a transducer shown in FIG. 2 mounted in a support frame.

The positive and negative displacement asymmetries are canceled out, and the acoustical energy output doubled, by driving two diaphragms 14*a*, 14*b* with one piezo bimorph actuator 12 between them. One diaphragm 14*a* in a convex curvature, the other concave, as shown in FIG. 3. This is essentially one diaphragm with an "S" shaped cross section, with the actuator 12 attached to the diaphragm at the mid-point of the "S". The diaphragm 14 can, however, be formed in two separate pieces 14*a*, 14*b* with their adjacent lateral edges both coupled to and driven by the same actuator 12.

Figure 4:
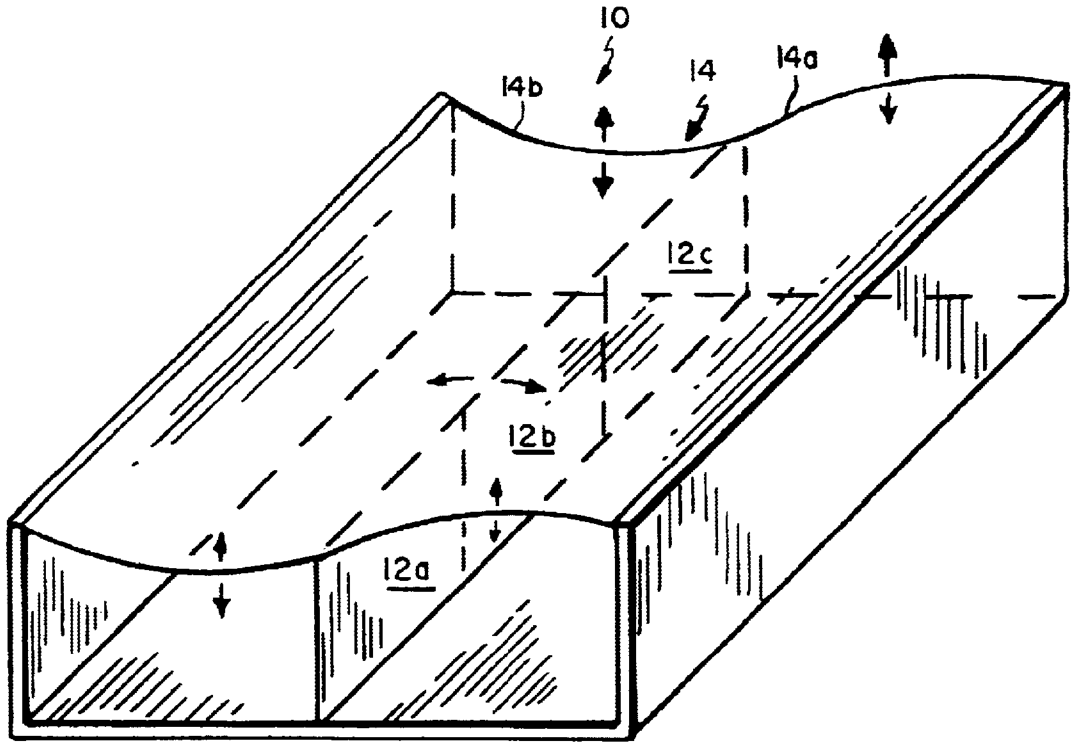
FIG. 4 is a view in perspective corresponding to FIG. 3 showing an alternative embodiment.
Figure 5:
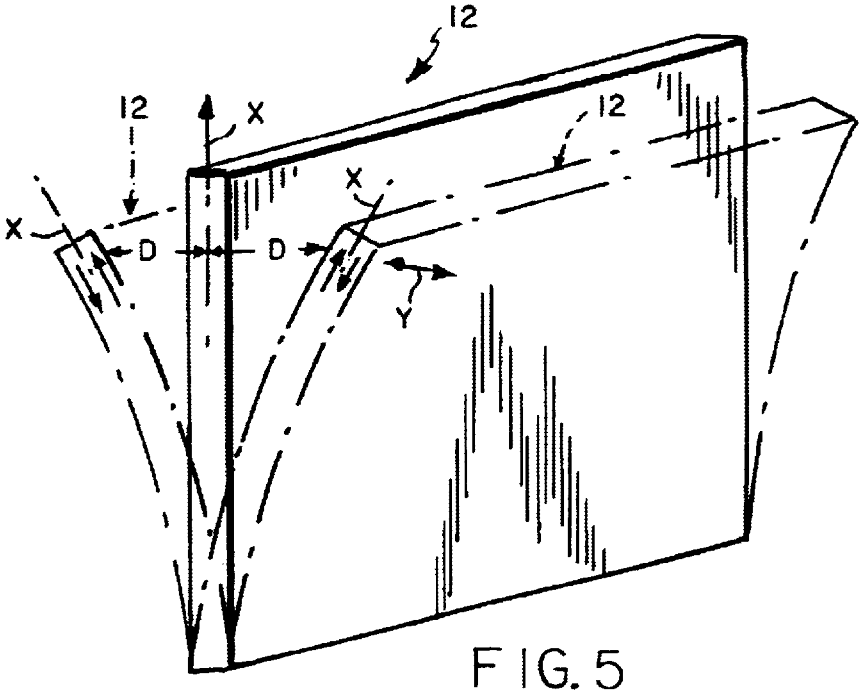
FIG. 5 is a view in perspective of the piezo bimorph actuator shown in FIG. 1 in its rest, and left and right flexed positions.
Figure 6:
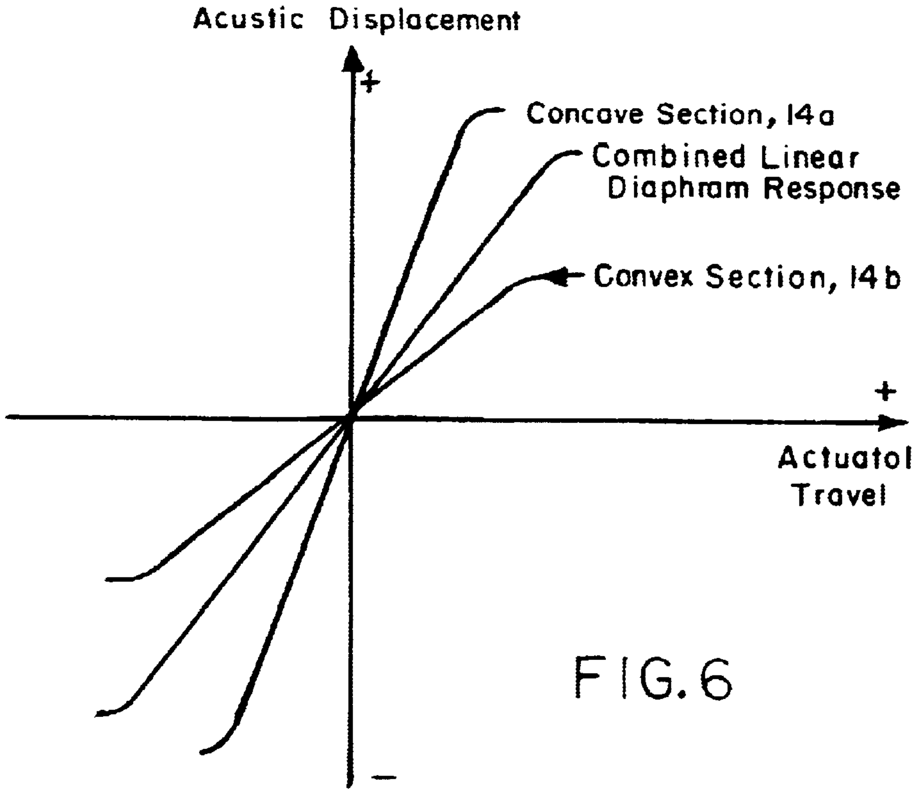
FIG. 6 is a graph showing the acoustic displacement of the diaphragm shown in FIGS. 2–4 as function of the linear, lateral displacement of the actuator for the concave and convex both sections of the diaphragm, and their combined net displacement which is substantially linear.

A single large bimorph 12 the extending "height" of the diaphragm may be used to drive the loudspeaker, or multiple actuators 12*a*, 12*b*, 12*c* may be employed as shown in FIG. 4, each being driven by a differently contoured frequency response, to shape the three dimensional output of the loudspeaker 10. For example, high frequency signals can be applied exclusively to one or more actuators. The area of the diaphragm portions coupled to these actuators controls the acoustical power and radiation pattern apportioned to the high frequency range.

Figure 18:
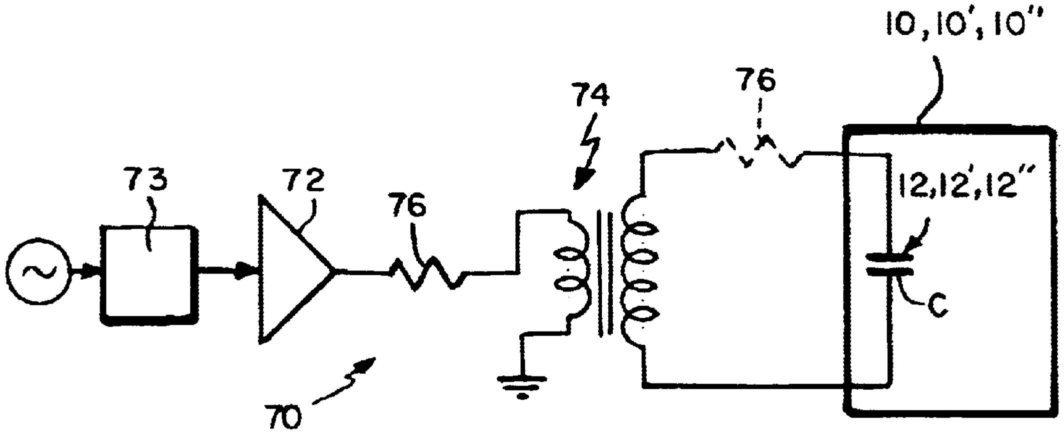
FIG. 18 is a simplified diagram of a drive circuit for a speaker according to the present invention.

An audio amplifier driving an electrical step-up transformer may be used to drive the loudspeaker 10 at the correct voltage required by the piezo crystal, or a dedicated amplifier may be tailored for the system. Piezo motors require a maximum drive voltage ranging from 30 to 120 Volts, depending on the piezo material chosen and the wiring configuration. FIG. 18 shows a suitable loudspeaker drive circuit 70 utilizing a conventional notch filter 73 operatively coupled to an audio amplifier 72 whose output is applied through a resistor 76 connected in series with a step-up transformer 74 that in turn drives the loudspeaker 10. The resistor 76 can be connected either before or after the transformer 74. It controls the roll off of the audio frequency response. Increasing the resistance lowers the frequency at which the roll off appears. The active filter is a conventional first order, band reject "notch" filter. For use with the test transducer described below, it has a Q of 2.8 to 3.0 and down dB of 13. As shown in FIG. 18, the resistor 76 is located "before" the transformer. An alternate location, "after" the transformer, is shown in dashed line. The transducer 10, 10', 10" is shown with a capacitor C inside. Thus C represents that a piezo actuator is in fact a capacitor, and presents a capacitive impedance as a load to the drive circuit. As will be discussed below, the transducer also exhibits in effect an acoustical "capacitance", and when operated with an enclosure, an acoustical "inductance". Step-up transformers for audio systems are common and comparatively inexpensive. However, performance can be improved if the input to the loudspeaker is a dedicated amplifier that produces an output tuned to the load without a separate transformer.

Figure 17:
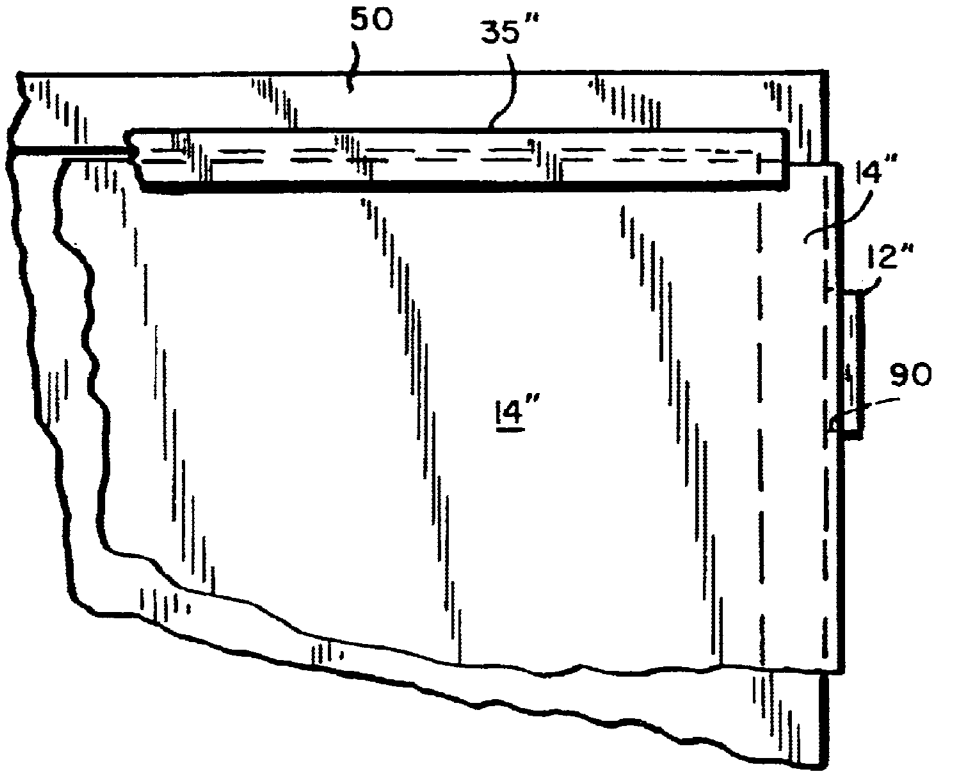
FIG. 17 is a detailed view of one comer of the speaker shown in FIG. 16.

A gasket 35, 35 (FIG. 3) of low density expanded closed cell foam rubber or similar material is inserted along the lateral periphery of the diaphragm to help to preserve the integrity of the pressure gradient of the system. In an alternative embodiment, as shown in FIG. 17, this edge seal is a strip of very thin, very flexible, closed-cell foam tape with an outer layer of an adhesive. The tape can extend along the slightly curved edges of the diaphragm, or it can overlie all four sides of the diaphragm.

A DC bias may be supplied to the piezo bimorph to reduce hysterisis effects at low signal levels. Bias can only be supplied with great difficulty to a magnetic loudspeaker. All electrostatic loudspeakers are designed this way.

By way of illustration but not of limitations, an actuator 12 made in the manner described above with respect to FIGS. 1–6, that is 2 inches high and 5 inches in length (along the "vertical" axis 30) (FIG. 5), with a diaphragm curvature height of 0.2 inch, will produce an output of 105 dB at 1 Watt measured at 1 meter, at 450 Hz. This is very efficient. Average moving coil loudspeakers have an efficiency in the range of 85–95 dB at 1 Watt/1 meter.

Figure 8:
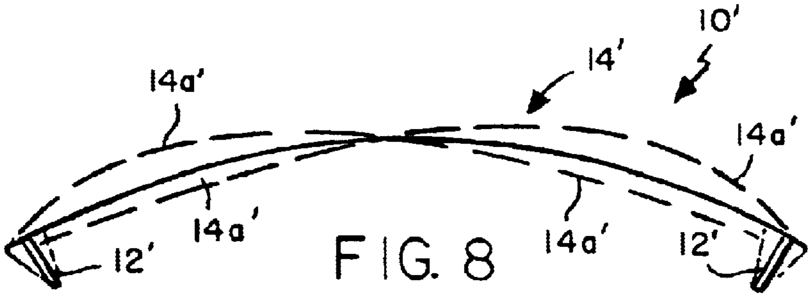
FIG. 8 is a view in side elevation of the flat screen transducer shown in FIG. 7.
Figure 7:
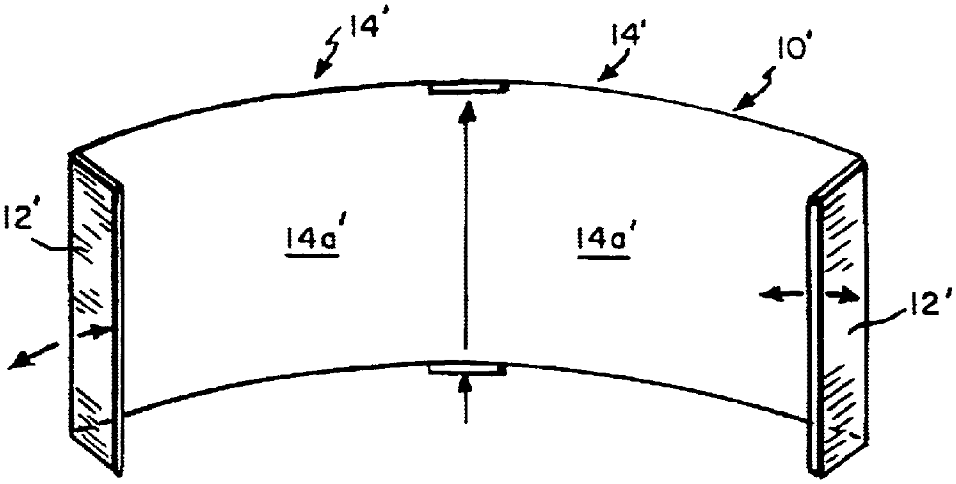
FIG. 7 is a highly simplified schematic view in perspective of yet another embodiment of a flat screen transducer according to the present invention that is particularly adapted for use in combination with a visual display screen.

In an alternate form shown in FIGS. 7–8, a transducer 10' of the present invention may be designed as a single-sided drive, single-curvature diaphragm speaker for specific purposes (in the FIGS. 7–8 embodiment, like elements are described with the same reference numbers used in FIGS. 1–6, but with a prime). The transducer 10' is adapted to be mounted over a visual display screen of a television, computer monitor, or the like.

In the FIGS. 7–8 embodiment, the actual speaker diaphragm 14' consists of an optically clear plastic sheet of slight curvature. The plastic sheet 14', supported on a thin frame, sits in front of the display screen (not shown). The frame can either be replaceably mounted over the screen, or permanently attached as in a retrofit of an existing display (e.g. a computer monitor), or permanently built into the display itself. As an example of a permanent installation, a conventional monitor can have an integrally-formed projecting peripheral flange that extends forwardly from the screen and mounts the transducer 10'. The visual display on the screen is therefore viewed through the actual speaker. Moreover, given the two section construction of the diaphragm, as described in more detail below, sound radiates independently from the left and right portions of the "speaker-screen". It is therefore essentially two transducers and two speakers in one frame, delivering stereophonic or multi-channel sound. Sound and voice are perceived as originating directly from the viewed source. The transducer 10' of this invention operates substantially in the frequency range of the human voice and on up (100–20 kHz). The lower bass range can be added with a separate sub-woofer, as is common practice in many sound systems. The transducer 10' radiates sound as a line or planar source. This directs sound at the user in a controlled fashion, avoiding reflections from the desktop or nearby surfaces, and eliminates reflections from the video screen, as the speaker is essentially the screen itself. Reflected acoustic energy degrades the performance of a speaker system, and is annoying and confusing to the human ear. The invention eliminates added speaker boxes on the desktop in computer systems, reducing clutter and freeing up valuable desktop space. In effect the transducer 10' is a virtually invisible speaker.

Turning to the specifics of the operation and construction of transducer 10', the diaphragm 14' is a thin, stiffly flexible sheet of optical quality plastic, such as polycarbonate or tri-acetate, or tempered glass sheet bonded with a plastic polarizing film, which thereby makes the transducer a combination loudspeaker and computer anti-glare screen. By way of illustration, but not of limitation, the diaphragm is approximately 300 mm×400 mm, or is sized to extend over the associated video display screen. The diaphragm is formed with a slight curvature shaped as a vertically aligned parabola of a "radius" of approximately 1 meter. The plastic sheet diaphragm 14' is mechanically pinned and/or adhesively bonded along a "vertical" at the centerline, top and bottom, in the speaker frame. ("Along a vertical centerline" as used herein does not mean that the attachment must be at exactly the center; it can be near the center, and in certain applications it may be desirable to have the line of attachment off-center, thereby producing diaphragms of differing sizes.) This center attachment creates two separate "wings" of the diaphragm 14' that are free to move independently, thus creating the left and right speaker sections 14*a*', 14*a*'. The vertical free ends of these diaphragm sections 14*a*', 14*a*' are each attached to one or more electro-mechanical actuators 12', 12' located vertically on the left and right speaker frame vertical members. The actuators 12', 12' operate laterally and, because they are coupled to the diaphragm sections 14a', 14a', they increase and decrease the curvature, and therefore the displacement, of the diaphragm sections 14a', 14a'. A small movement of the actuator 12' on the left speaker panel causes a forward bulge and positive pressure from that speaker; a negative pressure occurs with a leftward lateral actuator movement. The actuators may be of any electromechanical type, e.g., electromagnetic, piezo, electrostatic. In this application piezo is preferred because there are no magnetic fields to distort the video screen display. The coupling is preferably adhesive with the edge of the diaphragm abutting an end face of an actuator substantially at a right angle.

Figure 9:
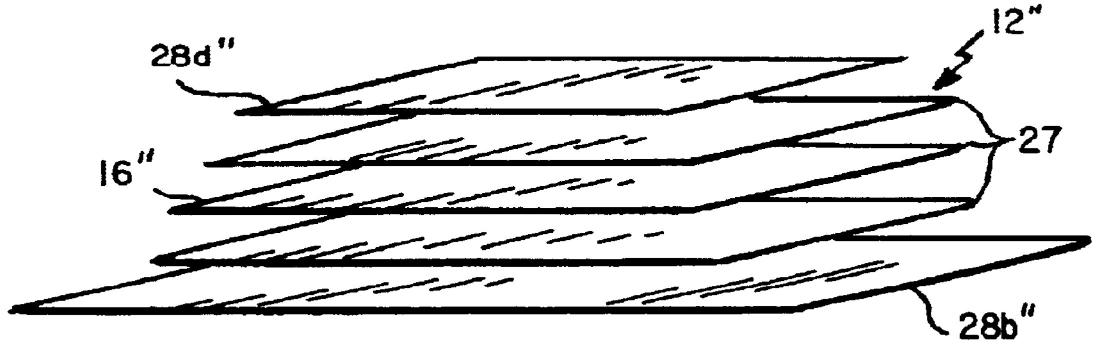
FIG. 9 is an exploded view in perspective of the component layers of a single-piezo-layer actuator for use in the present invention.
Figure 9A:
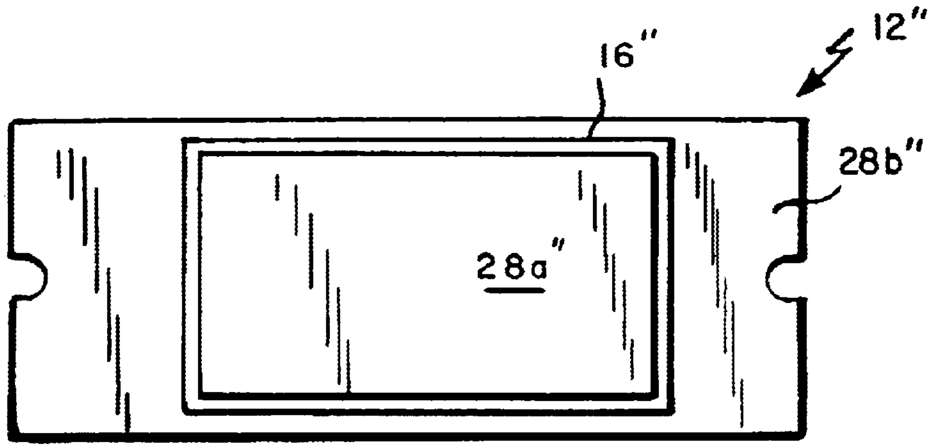
FIG. 9A is a top plan view of the piezo actuator shown in FIG. 9.
Figure 9B:
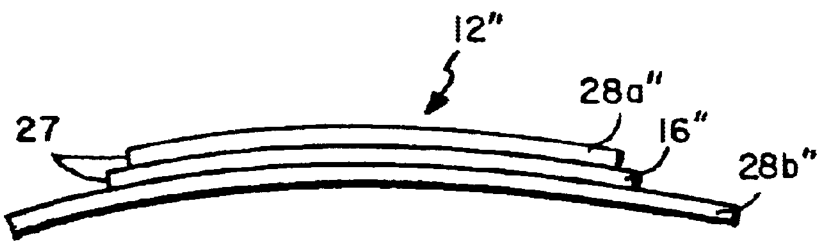
FIG. 9B is a view in side elevation of the piezo actuator shown in FIGS. 9 and 9A.

FIGS. 9–9B and 13–17 show a further, presently preferred, embodiment of the invention, a screen speaker 10' or 10" that uses a piezo motor 12" (like parts in this embodiment having the same reference number as in FIGS. 1–8, but double-primed) of the type supplied by FACE International Corp. under the trade designation "Thunder" actuator. As shown in FIG. 9, this motor is a "bender" in that it uses only a single layer 16" of piezo material sandwiched between two thin strips of metal 28a", 28b". The larger layer 28b" is preferably a thin sheet of stainless steel and the smaller metal layer 28a" is sheet aluminum. (Viewed from the side as in FIG. 9B, stainless steel side 28b", the actuator is slightly concave.) This composite structure is bonded by two adhesive layers 27, 27 in a slightly curved, pre-stressed condition (FIG. 9B). The "Thunder" actuator has the same excursion capabilities as the bimorph actuator 12 shown in FIGS. 1–5. It also has characteristics not found in the bimorph that make it well suited for this application. For one, because the piezo wafer 16' is encased on both sides by metal (the layers 28a", 28b"), the whole structure is quite rugged and less likely to shatter or to develop micro-cracks during use. Also, the fundamental resonant frequency of the actuator itself is quite high, typically above 3,000 Hz. While conventional piezo electric applications attempt to operate at or near a fundamental resonant frequency, the present preferred form of this invention operates mainly below this resonant frequency. This has distinct advantages as detailed below.

There are no resonances or harmonics present in the motor structure 12" from about 3,000 Hz down to direct current (0 Hz). In this range, the device is completely controlled by its compliance, and acts, due to the lack of any resonant modes, like a perfectly monotonic "textbook" transducer. Mechanically it is analogous to a diving board. This compliance is "low", that it, low enough so that when coupled to the mass of the diaphragm being driven, it produces a resonance at about 3,000 Hz.

Proceeding upward in frequency, there is a resonance at about 3,000 Hz, with a "Q" factor of about 3, exhibiting a narrow, high peak of about 15 dB. This resonance peak is quite audible, and must be equalized for the system to operate satisfactorily. Equalization may be accomplished in the active drive circuitry, or with passive electronic components. Above this resonant frequency some spurious resonances may be present at multiples, either fractional or integral, of the approximate 3,000 Hz fundamental resonance. These resonances may also be characterized as high Q resonances that affect only a narrow band of frequencies, and may be mechanically damped, in the ways customary to those skilled in the art. In the preferred form shown, this is accomplished by the careful application of various viscous or rubber-like compounds to the motor structure or to the diaphragm edges driven by the motor. Note that this discussion of resonances has referred primarily to the motor structure. All loudspeakers have resonances and response variations associated with the air-moving diaphragm, as does this invention. The following discussion turns to the moving-air diaphragm as it impacts on the operation of the present invention, and in particular compares its operation in an enclosure to free-air operation and to the operation of a typical loudspeaker.

The majority of known loudspeakers are operated in some sort of enclosure. If this were not the case, the back radiation would join with the (out-of-phase) front radiation, canceling the acoustic output. The acoustic radiation within the enclosure is sealed off, leaving only the energy from the front of the diaphragm to radiate. (The many variations of the bass reflex system, where the lower frequencies are augmented by the pressure within the enclosure, are a notable exception). The air within the enclosure acts as an acoustic compliance, a spring, and is analogous to an electrical capacitor in series with the drive to the loudspeaker. Conventional loudspeakers, in sharp contrast with the present invention, operate exclusively above their resonant frequency, above which point they are mass controlled. This mass is analogous to an inductor in an electrical circuit. The combination of the acoustic inductance represented by the moving mass of the system, and the acoustic, "capacitive" compliance of the speaker combined with the equivalent capacitance of the air in the enclosure, creates the acoustical equivalent of a second order high-pass electronic filter. In practice, the smaller the enclosure, the less bass; the smaller the enclosure, the higher the "Q" of the second order high pass filter, and the system response develops a peak before low frequency roll-off.

In the present invention, both the acoustic load and the electrical load are capacitive. The present invention relies on the low compliance of the motor to control the motion. This compliance is the mechanical equivalent of a capacitor in an electrical circuit. Driving a capacitive load in series with the capacitance of the air in an enclosure results in an acoustical equivalent of a simple voltage divider in the electrical analog circuit. The entire output level at all frequencies is reduced. In practice, the net result is a loudspeaker 10" that is substantially unaffected by the size of the box in which it is enclosed. This simple fact has important commercial implications in terms not only of space, utilization, compactness, and adaptability to retrofit existing products with screen speakers, but also in terms of the frequency response and drive stabilization of the audio system. This latter point is described in more detail below.

Driving a capacitive load requires care. Yet, it is impossible to categorize the input impedance that the transducer/speaker of the present invention as an 8 Ohm or 4 Ohm speaker (the most common values of speaker input impedances and a common way to characterize conventional speakers to match the drive to the load for optimal performance).

Figure 10:
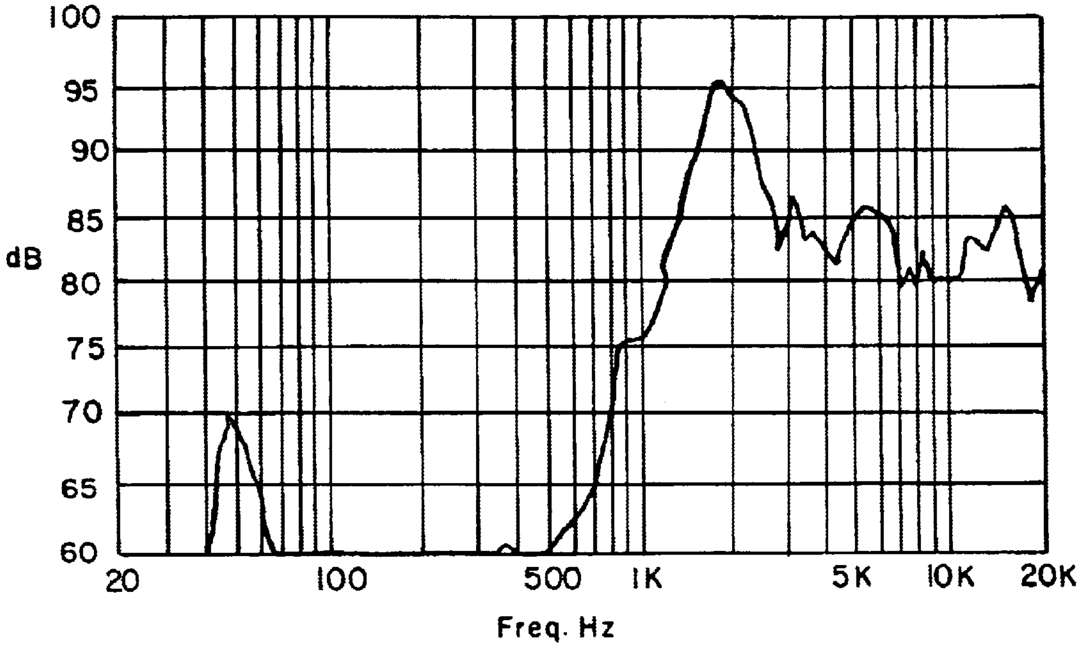
FIG. 10 is a graph of acoustic, on-axis, pressure response as a function of the frequency for a transducer according to the present invention operated in free air, and using an actuator of the type shown in FIG. 9.
Figure 11:
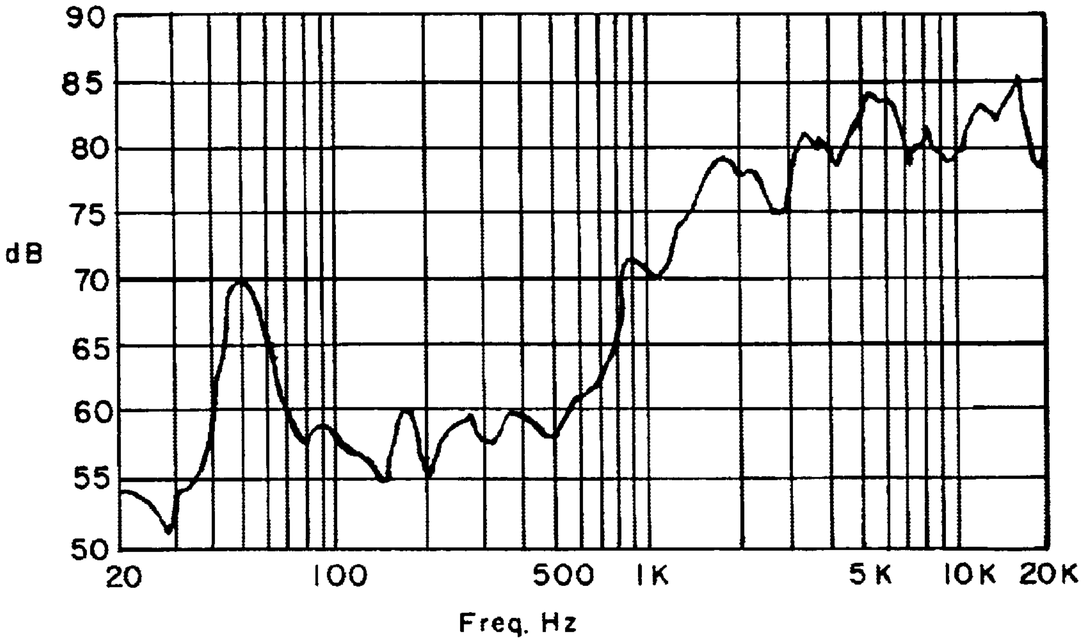
FIG. 11 is a graph corresponding to FIG. 10 where the same transducer is operated with an active electronic filter to smooth out the major system resonance in the audio output.
Figure 12:
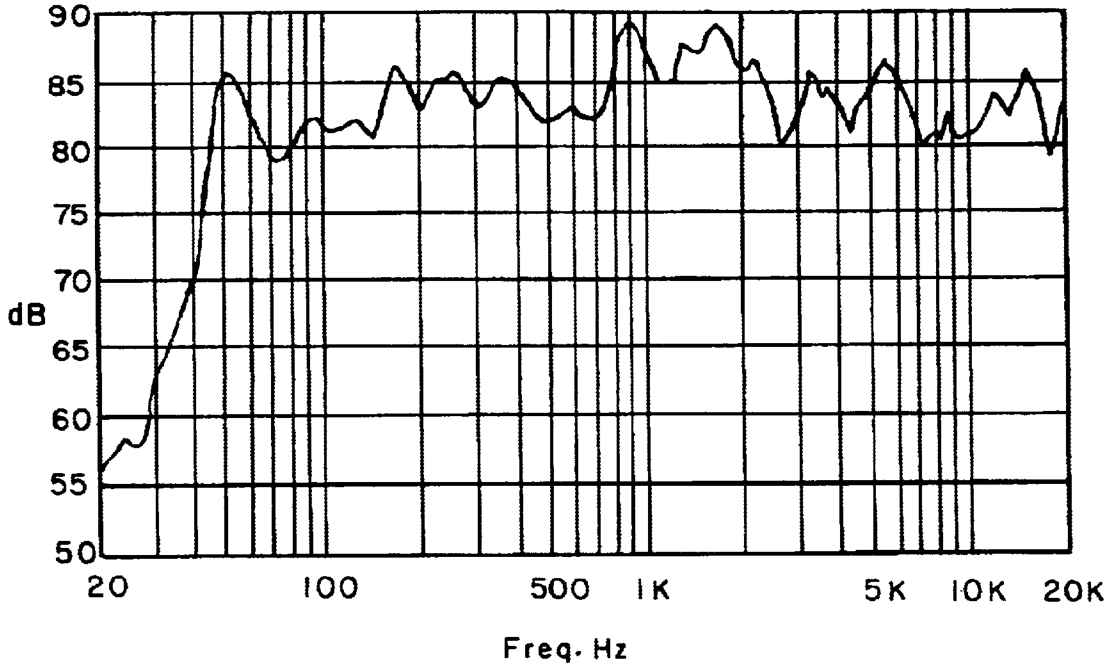
FIG. 12 is a graph corresponding to FIGS. 10 and 11 where the same transducer is operated with the active filter and in an enclosure.
Figure 13:
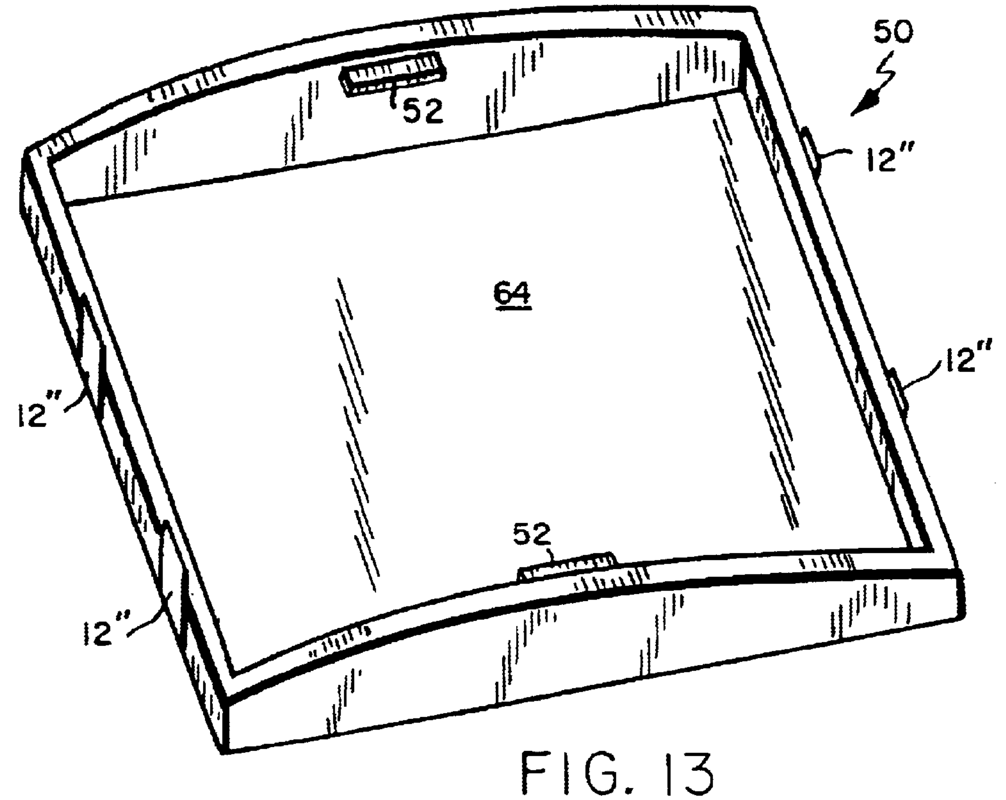
FIG. 13 is a view in perspective of a frame with diaphragm attachment mechanisms according to the present invention.
Figure 14:
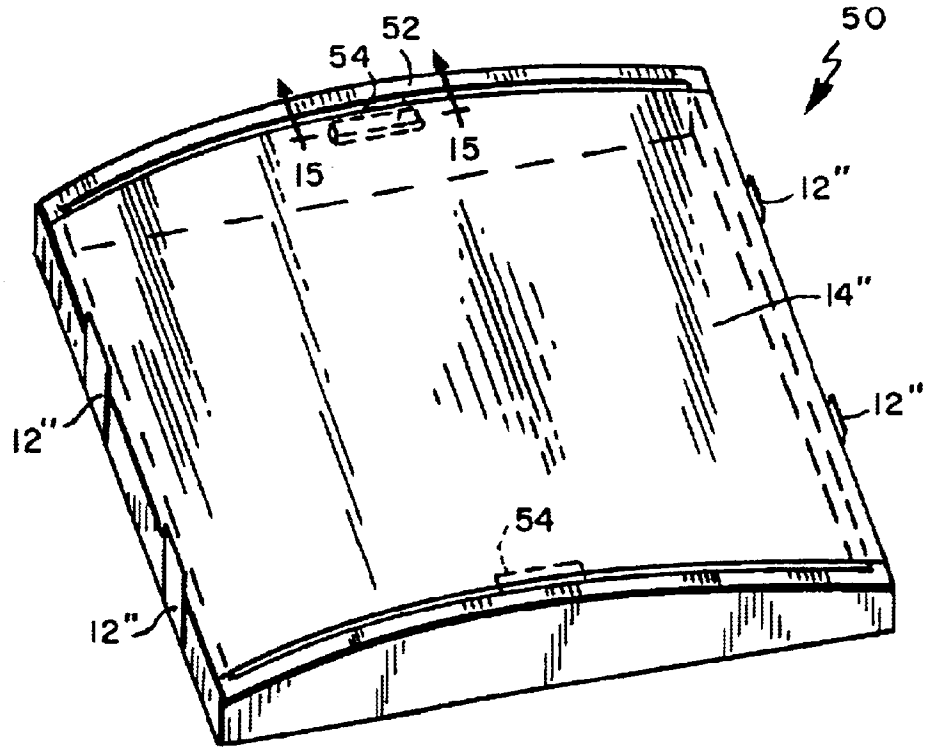
FIG. 14 is a view corresponding to FIG. 13, but showing a diaphragm mounted on and attached to the frame shown in FIG. 13 to form a flat-screen speaker according to the present invention.
Figure 15:
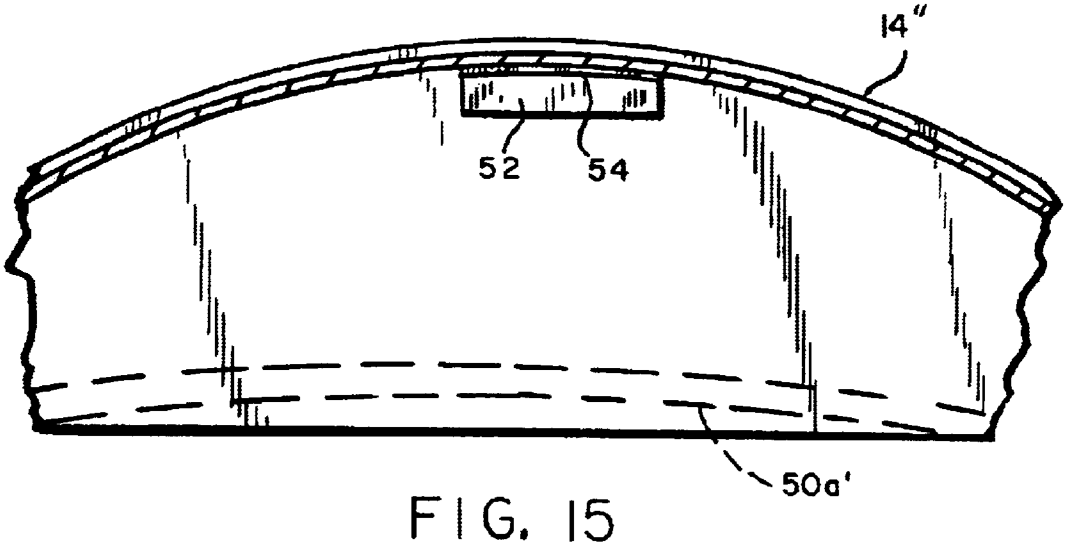
FIG. 15 is a detailed view in vertical section taken along the line 15—15 in FIG. 14 showing the diaphragm midpoint support.
Figure 16:
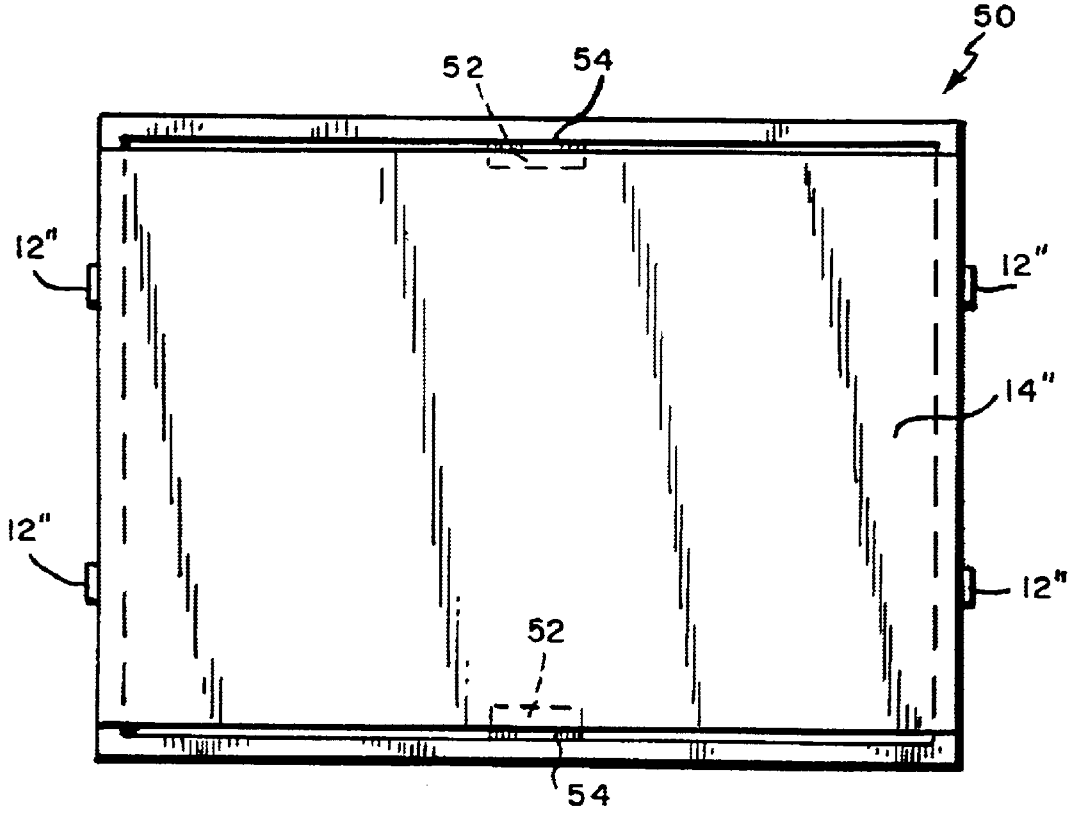
FIG. 16 is a top plan view of the flat-screen speaker shown in FIGS. 14 and 15.

A test transducer was built using a single FACE piezo actuator 12" operatively coupled to a diaphragm 14" formed from a 10 mil thick, 5½ inches by 6½ inches sheet of a polycarbonate that is curved with a 48 inch radius of curvature. The test actuator 12 has an electrical capacitance of $9\times10^{-9}$ Farad. The drive circuit 20 (FIG. 18) used a step-up transformer 74 voltage ratio of 1:19.5 with a power output of about 6 watts. A low end impedance of this actuator (alone), so driven at 300 Hz., is about 156 Ohms, This test transducer produced the free-air operating characteristics shown in FIG. 10. On-axis audio power output by the transducer (dB) is plotted as a function of the frequency of the drive signal ($H_3$). FIG. 11 shows the frequency response of the same transducer where the input drive signal to the actuator was actively filtered using the conventional first order band reject "notch" filter 73 with a down dB of 13 and a Q of 2.8 to 3.0. FIG. 12 shows the operation of this same transducer with the same filter and with the transducer mounted in a small enclosure of conventional painted "MDF" (medium density fiberboard "wood") product having dimensions of about 13 inches (length) by 10 inches (width) by 1 inch (height), or a volume of about 130 square inches. At the high end of the speaker frequency spectrum, e.g. at 20 kHz, the impedance of the test actuator alone drops to about 2.5 Ohms, low enough to cause instability and damage to many amplifiers. By operating below the resonance of the transducer, this problem does not arise with the present invention. Frequency response, alteration and drive stabilization are accomplished together.

Above its piston range, a conventional or "textbook" loudspeaker will exhibit an on-axis audio pressure response rising at 6 dB/octave. (The piston range is where the wavelength of the sound produced in air is comparable to the size of the diaphragm, typically taken as the diameter of circular diaphragms.) For the test transducer example of the present invention, the response above 2,000 Hz rose at 6 dB/octave. The diaphragm and its curvature were chosen to locate the major resonance outside the audible range. Driving the speaker in series with a 6 Ohm resistor 76 corrected the frequency response, and gave a safe operating impedance and the on-axis audio pressure response characteristics shown in FIGS. 11 and 12. Note that the resonance peak at about 2,000 Hz in FIG. 10 is not present in FIGS. 11 and 12.

Viewed more broadly, the devices of the present invention operate as transformers, converting a high-force, short-excursion generally linear actuator movement into a high-excursion, low-pressure diaphragm movement. This represents a new class of acoustic transducers. At high diaphragm excursions the positive pressure displacement will be less than the negative displacement, i.e. the system will be inherently non-linear in a very controlled manner. The transfer function may be calculated from the radius of curvature. A mirror image transfer function can be applied to the driving electronics at slight cost to control non-linearity.

FIGS. 13–17 show a frame 50 that mounts the diaphragm 14". The frame can be formed from any suitable structural material such as wood or "MDF" often used for loudspeaker enclosures. It can have a back panel 50*a* to itself form a loudspeaker enclosure, or it can be mounted over a CRT screen, e.g. of a computer monitor or television screen, with that screen acting as a back panel of the enclosure (shown as an alternate 50*a* in dashed lines). The enclosure acts to isolate the rear radiation allowing only radiation from the front of the diaphragm to radiate to the listener.

When the frame is used over a CRT screen, the screen-to-diaphragm spacing is typically in the range of ¾ inch to 1¼ inches. Note that while the diaphragm is generally planar, it itself is not perfectly "flat". However, the overall transducer is "flat" or "planar", for example, as those terms are used in describing "flat" or "wall-mounted" television displays or laptop computer displays in comparison to televisions or computer monitors using cathode ray tubes.

The frame supports two actuators 12" at each lateral edge that act in the manner of the actuators 12' in FIGS. 7 and 8. The diaphragm is slightly curved, as shown, and supported at its lateral midpoint between the actuators on supports 52, 52 that are clamped, glued, or otherwise affixed to the frame 50. The diaphragm 14" in turn is clamped or glued to a rigid vibration damping layer 54 on the supports 52, 52. The diaphragm 14" is preferably adhered to the actuators 12" at their upper free ends. The mounting preferably is at a notch 90 cut into the diaphragm edge, with the edge of the diaphragm in an abutting relationship with the face of stainless steel strip 28*b*" of the actuator free end. An adhesive such as the cyanoacrylic ("CA") glue commonly used in acoustic applications can be used. Thus mounted and driven, the diaphragm 14" operates as shown and described with regard to FIGS. 7 and 8.

FIG. 17 shows a gasket 35" in the form of a very thin, very flexible, adhesive tape formed of a closed-cell foam material. It overlies the edges of the diaphragm and adheres to it and the frame to block the flow of acoustical energy from the rear to the front of the diaphragm. Other sealing members such as half-round foam strips can be wedged or adhered at the edges of the diaphragm. Ideally, the gasket 35", in whatever form, dampens spurious resonances from at about 6 KHz and higher.

While the invention has been described with respect to its preferred embodiments, it will be understood that various modifications and alterations will occur to those skilled in the art. For example, the diaphragm 14" can be driven in vertical sections by different actuators that are dedicated to different output bandwidth, or to bands of diaphragm 14" segments that are physically separated from one another along the lines of the embodiment described with respect to FIG. 4. As noted above, non-piezo actuators can be used, albeit with a loss of many of the advantages described herein. A wide variety of mechanical mounting arrangements are also contemplated, including mechanical clamps, clips, and snap-on retainers to secure the diaphragm to actuators and support members. Further, while the invention has been described with reference to a frame as a fixed anchor point, it will be understood that the support can be any of a wide variety of structures as long as they hold one portion of the diaphragm stationary at a point spaced from, and "opposing", the movement of the actuator. The support, or anchor point, can, for example, be a portion of a CRT video display housing, or a liquid crystal display housing. While the diaphragm 14, 14', 14" has been shown and described as generally rectangular in shape, it can assume other shapes. However, it must have the functional characteristics described above and be able to be mounted to be driven by an actuator operating generally in line with the diaphragm causing it to flex to produce sound waves as described above when anchored at a point spaced from the actuator in the direction of its motion. The diaphragm is curved, and for most applications a small degree of curvature, but much more severe curvatures can nevertheless also work.

These and other modifications and variations that will occur to those skilled in the art are intended to fall within the scope of the appended claims.

What is claimed is:

1. An acoustic transducer that converts a mechanical motion into acoustical energy comprising:

a thin sheet diaphragm that is curved in a plane transverse to a first direction, a support that fixes one generally linear portion of said diaphragm along said first direction, and at least one actuator operatively coupled to said diaphragm and generally aligned with, but mutually spaced from said fixed generally linear portion in a second direction transverse to said first direction by a distance that produces a curvature of said diaphragm and that accommodates a movement of said diaphragm that corresponds to the travel of said actuator, said diaphragm movement being amplified with respect to said actuator travel and generally transverse to the direction of said actuator travel.

2. The acoustic transducer of claim 1 wherein said at least one actuator is characterized by a high force and short linear travel.

3. The acoustic transducer of claim 1 wherein said at least one actuator is a piezo actuator.

4. The acoustic transducer of claim 1 wherein said curvature is generally parabolic.

5. The acoustic transducer of claim 2 further comprising a seal at at least a portion of the periphery of said diaphragm to assist in maintaining the acoustic pressure gradient across said transducer.

6. The acoustic transducer of claim 5 wherein said actuator is a piezo bimorph drive, and said operative coupling is generally at the center of said diaphragm to divide said diaphragm into two sections, and where said diaphragm curvature in one section is convex, and in the other section is concave.

7. An acoustic transducer according to any of claims 4 or 5 for use in combination with a video screen display wherein said support overlies the screen display and said diaphragm is generally coextensive with, and closely spaced from, said screen display.

8. The acoustic transducer of claim 7 wherein said actuator is a piezoelectric drive and said diaphragm is formed of an optically clear material.

9. The acoustic transducer of claim 7 wherein said diaphragm is fixed along its vertical centerline, and said actuator is a pair of actuators that are each operatively coupled to one lateral edge of said diaphragm to form two diaphragm sections each generally coincident with about half of the screen display.

10. The acoustic transducer of claim 8 wherein said piezoelectric drive is a single layer piezo actuator.

11. The acoustic transducer of claim 1 further comprising an electronic drive circuit operatively connected to said actuator.

12. The acoustic transducer of claim 11 wherein said drive circuit comprises an active filter and an amplifier.

13. The acoustic transducer of claim 12 wherein said drive circuit further comprises a step-up transformer and a resistor connected in series with said transformer to control high frequency response.

14. The acoustic transducer of claim 12 wherein said drive circuit drives said actuator to control operation at a main resonance in the transducer output.

* * * * *